(12) United States Patent
Matsuda et al.

(10) Patent No.: US 9,547,090 B2
(45) Date of Patent: Jan. 17, 2017

(54) X-RAY COMPUTED TOMOGRAPHY APPARATUS AND X-RAY DETECTOR

(71) Applicant: TOSHIBA MEDICAL SYSTEMS CORPORATION, Otawara-Shi (JP)

(72) Inventors: Keiji Matsuda, Nasushiobara (JP); Shuya Nambu, Nasushiobara (JP); Takaya Umehara, Kuki (JP); Atsushi Hashimoto, Otawara (JP); Takashi Kanemaru, Yaita (JP); Akira Nishijima, Nasushiobara (JP); Koichi Miyama, Nasushiobara (JP); Tomoe Sagoh, Utsunomiya (JP)

(73) Assignee: TOSHIBA MEDICAL SYSTEMS CORPORATION, Otawara-shi (JP)

( * ) Notice: Subject to any disclaimer, the term of this patent is extended or adjusted under 35 U.S.C. 154(b) by 0 days.

(21) Appl. No.: 14/802,176

(22) Filed: Jul. 17, 2015

(65) Prior Publication Data
US 2016/0033657 A1    Feb. 4, 2016

(30) Foreign Application Priority Data

Jul. 31, 2014 (JP) ................................. 2014-156384

(51) Int. Cl.
| | | |
|---|---|---|
| *G01T 1/24* | (2006.01) | |
| *H04N 5/32* | (2006.01) | |
| *G01T 1/29* | (2006.01) | |

(52) U.S. Cl.
CPC .............. *G01T 1/241* (2013.01); *G01T 1/242* (2013.01); *G01T 1/247* (2013.01); *G01T 1/2985* (2013.01); *H04N 5/32* (2013.01)

(58) Field of Classification Search
CPC ....... G01N 23/046; G01T 1/241; G01T 1/242; G01T 1/247; H04N 5/32
See application file for complete search history.

(56) References Cited

U.S. PATENT DOCUMENTS 6,776,762 B2    8/2004    Erikson et al.
2008/0230922 A1*    9/2008    Mochizuki .......... H01L 21/6835
                                                                257/777

FOREIGN PATENT DOCUMENTS

JP    2013-106997    6/2013

* cited by examiner

*Primary Examiner* — Mark R Gaworecki
(74) *Attorney, Agent, or Firm* — Oblon, McClelland, Maier & Neustadt, L.L.P.

(57) ABSTRACT

An X-ray computed tomography apparatus according to an embodiment includes an X-ray detector that includes a first semiconductor chip including a plurality of elements configured to convert X-rays into an electrical signal, a substrate configured to collect the electrical signal from each element, a second semiconductor chip that is provided between the first semiconductor chip and the substrate and is formed of the same material as that of the first semiconductor chip, a plurality of first electrodes configured to couple each element of the first semiconductor chip to the second semiconductor chip, and a plurality of second electrodes that are configured to couple the second semiconductor chip to the substrate and are larger than the first electrodes. The second semiconductor chip wires the first electrodes and the second electrodes on a one-to-one basis.

10 Claims, 7 Drawing Sheets

← SLICE DIRECTION →

X-RAY COMPUTED TOMOGRAPHY APPARATUS AND X-RAY DETECTOR

CROSS-REFERENCE TO RELATED APPLICATIONS

This application is based upon and claims the benefit of priority of the prior Japanese Patent Application No. 2014-156384, filed on Jul. 31, 2014, the entire contents of which are incorporated herein by reference. The entire contents of the prior Japanese Patent Application No. 2015-139066, filed on Jul. 10, 2015, are also incorporated herein by reference.

FIELD

Embodiments described herein relate generally to an X-ray computed tomography apparatus and an X-ray detector.

BACKGROUND

An X-ray computed tomography (CT) apparatus is a device that images the inside of a subject by scanning the subject by using X-rays and performing processing on collected data with a computer.

For example, the X-ray CT apparatus exposes the subject to X-rays a plurality of times in different directions and detects signals of X-rays that transmitted through the subject with X-ray detection elements (hereinafter, simply described as "detection elements"). The detection elements include scintillators and a photodiode (PD) chip, for example. The X-ray CT apparatus collects the detected signals, and performs A/D conversion and then preprocessing and others on the collected signals to generate projection data. The X-ray CT apparatus then performs reconstruction processing based on the projection data and generates an image.

In the X-ray CT apparatus, an output line may be provided for each detection element and a simultaneous collection method in which the signals detected by the respective detection elements are simultaneously collected may be employed. In this case, as a method to take out the signals from the respective detection elements, available are a method using bonding wire and a method using a ball grid array (BGA).

In the method using bonding wire, the signals are collected by extending signal lines up to the end of the PD chip. That is, in this method, because the signal lines run through between the detection elements, the light-receiving areas of the detection elements are impaired. In contrast, in the method using a BGA, because the signals are collected from respective electrodes on the bottom of the PD chip with electrodes in a ball shape such as solder balls, the light-receiving areas are not impaired. Thus, in a multi-line X-ray detector, the method using a BGA is widely employed.

Meanwhile, in the X-ray CT apparatus, to enhance a spatial resolution, achieving high definition of detection elements has been advancing. When the above-described method using a BGA is employed, the pitch (width) of the ball-shaped electrodes narrows along with the implementation of high definition. However, there are limitations on the pitch of the ball-shaped electrodes formed between the PD chip and a substrate that is for collecting the signals from the PD chip. Thus, achieving high definition by the method using a BGA depends on the pitch of the ball-shaped electrodes.

DETAILED DESCRIPTION

An X-ray computed tomography apparatus according to an embodiment includes an X-ray detector that includes a first semiconductor chip including a plurality of elements configured to convert X-rays into an electrical signal, a substrate configured to collect the electrical signal from each element, a second semiconductor chip that is provided between the first semiconductor chip and the substrate and is formed of the same material as that of the first semiconductor chip, a plurality of first electrodes configured to couple each element of the first semiconductor chip to the second semiconductor chip, and a plurality of second electrodes that are configured to couple the second semiconductor chip to the substrate and are larger than the first electrodes. The second semiconductor chip wires the first electrodes and the second electrodes on a one-to-one basis.

With reference to the accompanying drawings, the following describes an X-ray computed tomography (CT) apparatus and an X-ray detector according to embodiments.

First Embodiment

Figure 1:
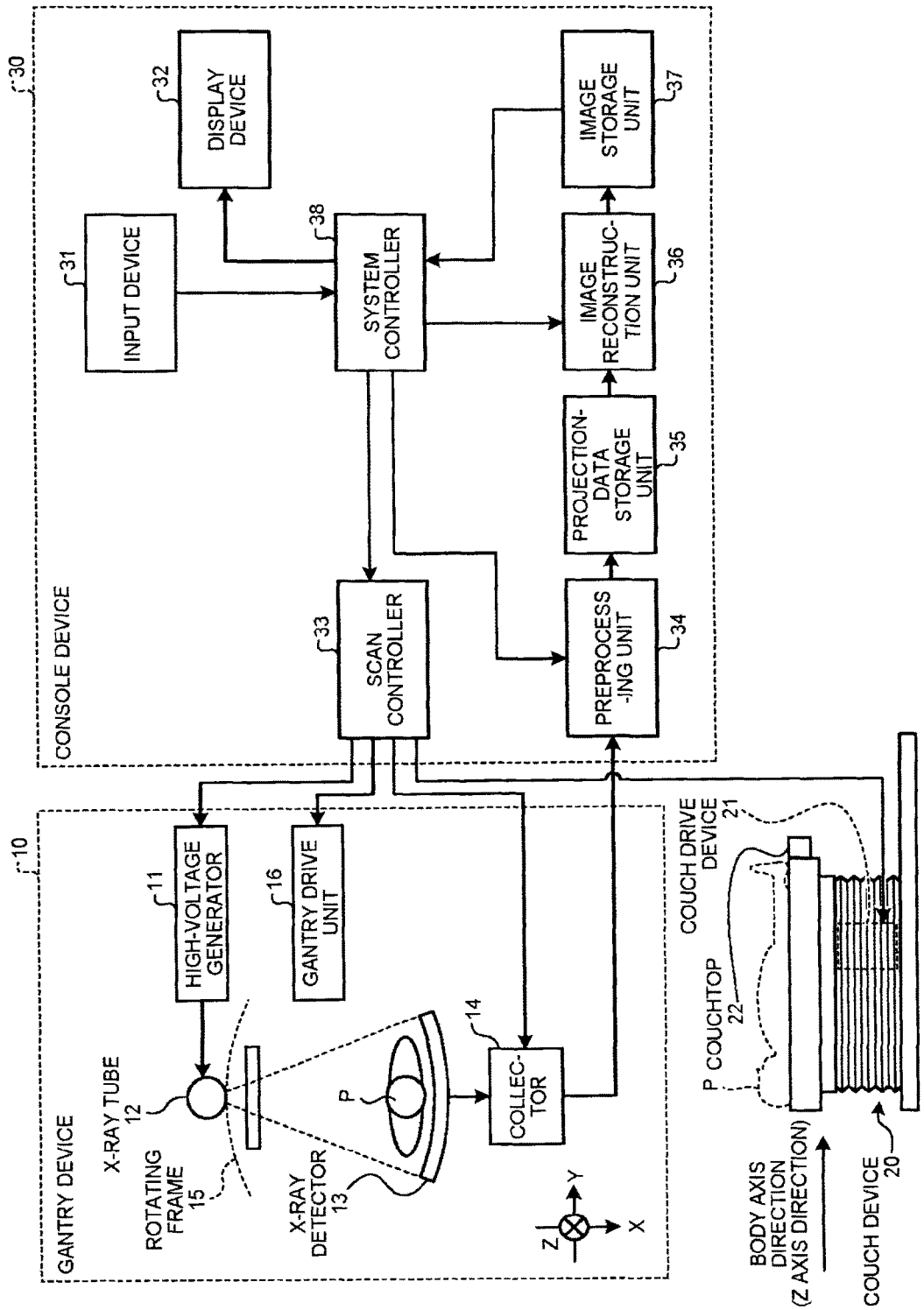
FIG. 1 is a block diagram illustrating an example of the configuration of an X-ray CT apparatus according to a first embodiment.

FIG. 1 is a block diagram illustrating an example of the configuration of an X-ray CT apparatus according to a first embodiment. As illustrated in FIG. 1, the X-ray CT apparatus in the first embodiment includes a gantry device 10, a couch device 20, and a console device 30.

The gantry device 10 is a device that irradiates a subject P with X-rays and collects X-ray detection data. The gantry device 10 includes a high-voltage generator 11, an X-ray tube 12, an X-ray detector 13, a collector 14, a rotating frame 15, and a gantry drive unit 16.

The high-voltage generator 11 is a device that generates a high voltage and supplies the generated high voltage to the X-ray tube 12. The X-ray tube 12 is a vacuum tube that generates X-rays by the high voltage supplied from the high-voltage generator 11, and with the X-rays generated by the X-ray tube 12, the subject P is irradiated.

The X-ray detector 13 detects the X-rays that are emitted from the X-ray tube 12 and transmitted through the subject P. The X-ray detector 13 is a two-dimensional array detector in which a plurality of X-ray detection elements (hereinafter, simply described as "detection elements") are arrayed in a lattice shape, for example. Of the array directions of the detection elements arrayed in the lattice shape, the direction corresponding to the direction of the body axis of the subject P is referred to as a "slice direction" and the direction orthogonal to the slice direction is referred to as a "channel direction." The two-dimensional array structure of the X-ray detector 13 is not necessarily limited to a flat structure, and it may be curved.

Figure 2:
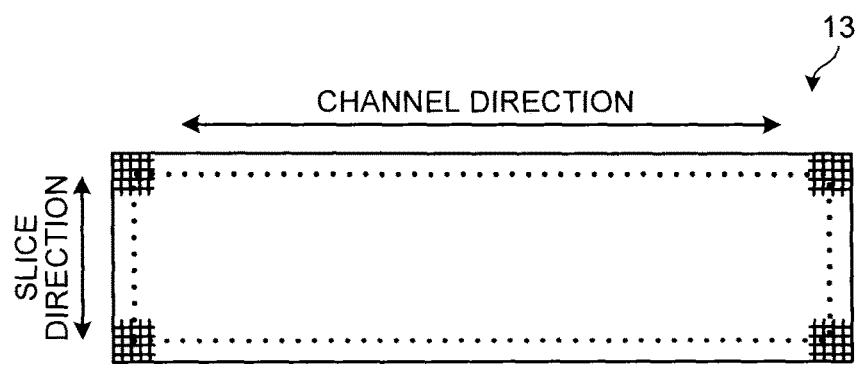
FIG. 2 is a diagram illustrating one example of a detection element array of an X-ray detector in the first embodiment.

FIG. 2 is a diagram illustrating one example of a detection element array of the X-ray detector 13 in the first embodiment. In FIG. 2, the array of detection elements viewed from the irradiation direction of X-rays is illustrated. As illustrated in FIG. 2, in the X-ray detector 13, the respective detection elements are arrayed in a lattice shape in the slice direction and the channel direction. While only the array of detection elements is exemplified here for the convenience of explanation, each of the detection elements is formed on a circuit substrate.

The rotating frame 15 is a frame formed in an annular shape. The rotating frame 15 supports the X-ray tube 12 and the X-ray detector 13 so as to face each other interposing the subject P. The gantry drive unit 16 is a device that, by rotatively driving the rotating frame 15, rotates the X-ray tube 12 and the X-ray detector 13 on a circular path centering around the subject P.

The collector 14 collects the signals of X-rays detected by the X-ray detector 13, generates data (X-ray detection data) of a digital signal, and transmits the generated X-ray detection data to the console device 30. The collector 14 includes a plurality of data acquisition system (DAS) chips. For example, the DAS chips generate the X-ray detection data by performing amplification processing, A/D conversion processing, and others on the signals of X-rays detected by the respective detection elements of the X-ray detector 13. The DAS chips then transmit the generated X-ray detection data to the console device 30. The X-ray detector 13 and the collector 14 are included in the X-ray detector.

The couch device 20 is a device to place the subject P thereon, and as illustrated in FIG. 1, includes a couchtop 22 and a couch drive device 21. The couchtop 22 is a bed on which the subject P is placed. The couch drive device 21 moves the subject P inside the rotating frame 15 by moving the couchtop 22 in the body axis direction (Z axis direction) of the subject P.

The console device 30 is a device that receives the operation of the X-ray CT apparatus by an operator and reconstructs tomographic image data and volume data from the X-ray detection data generated by the gantry device 10. As illustrated in FIG. 1, the console device 30 includes an input device 31, a display device 32, a scan controller 33, a preprocessing unit 34, a projection-data storage unit 35, an image reconstruction unit 36, an image storage unit 37, and a system controller 38.

The input device 31 includes a mouse, a keyboard, buttons, a trackball, a joystick, and others for the operator, such as doctors and engineers who operate the X-ray CT apparatus, to input various instructions, and transfers the various commands received from the operator to the system controller 38, which will be described later.

The display device 32 includes a monitor to display a graphical user interface (GUI) to receive the instructions from the operator via the input device 31, and to display images stored in the image storage unit 37, which will be described later.

The scan controller 33 controls the operation of the high-voltage generator 11, the gantry drive unit 16, the collector 14, and the couch drive device 21. Consequently, the scan controller 33 controls X-ray scan processing of the subject P in the gantry device 10, collection processing of X-ray detection data, and data processing on the X-ray detection data.

Specifically, the scan controller 33 causes X-ray scans to be performed by making the X-ray tube 12 emit X-rays continuously or intermittently while making the rotating frame 15 rotate. For example, the scan controller 33 causes X-ray scans to be performed such as helical scans in which photographing is performed by making the rotating frame 15 rotate continuously while moving the couchtop 22, and conventional scans in which photographing is performed by making the rotating frame 15 rotate one full turn or rotate continuously while keeping the location of the subject P fixed.

The preprocessing unit 34 generates projection data by performing, on the X-ray detection data transmitted from the collector 14, logarithmic conversion processing and correction processing such as offset correction, sensitivity correction, and beam hardening correction. The projection-data storage unit 35 stores therein the projection data generated by the preprocessing unit 34.

The image reconstruction unit 36 generates various images from the projection data stored in the projection-data storage unit 35 and stores the generated images in the image storage unit 37. For example, the image reconstruction unit 36 reconstructs X-ray CT images by performing back-projection processing (for example, back-projection processing by a filtered back projection (FBP) method) on the projection data and stores the reconstructed X-ray CT images in the image storage unit 37.

The system controller 38 performs overall control of the X-ray CT apparatus by controlling the operation of the gantry device 10, the couch device 20, and the console device 30. Specifically, the system controller 38 controls, by controlling the scan controller 33, the collection processing of the groups of X-ray detection data by the gantry device 10 and the couch device 20. The system controller 38 further controls the image processing performed in the console device 30 by controlling the preprocessing unit 34 and the image reconstruction unit 36. The system controller 38 further performs control such that the display device 32 displays the various images stored in the image storage unit 37.

As described, the overall configuration of the X-ray CT apparatus in the first embodiment has been explained. Based on such a configuration, the X-ray CT apparatus in the first embodiment is configured such that the X-ray detection in higher definition can be yielded.

Figure 3:
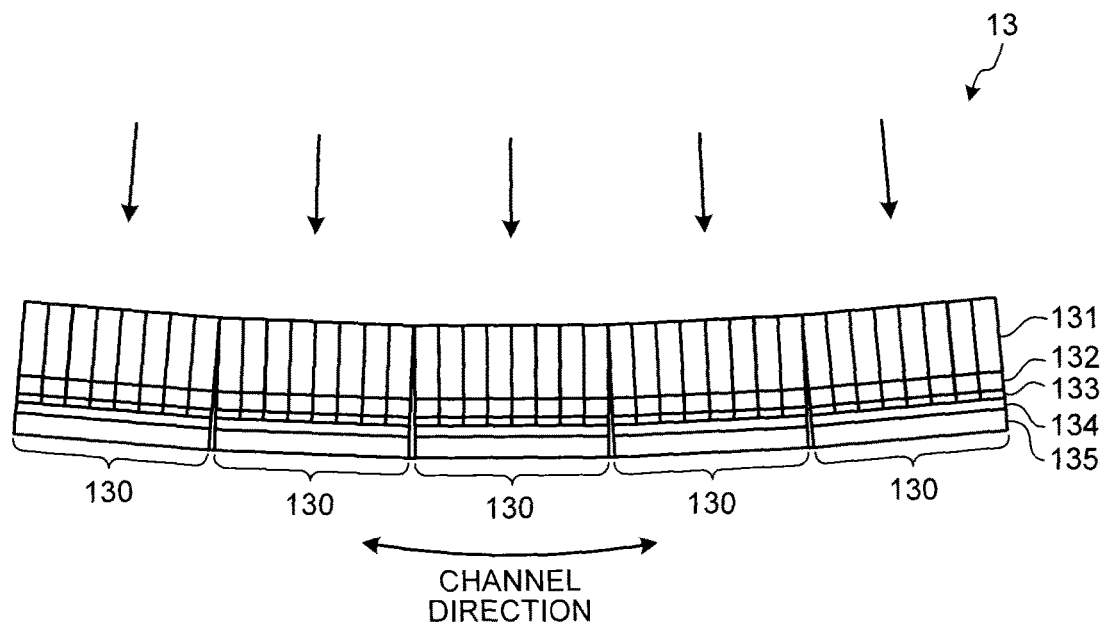
FIG. 3 is a diagram for explaining the structure of the X-ray detector in the first embodiment.

FIG. 3 is a diagram for explaining the structure of the X-ray detector 13 in the first embodiment. In FIG. 3, the structure of the X-ray detector 13 viewed from the slice direction is illustrated. As illustrated in FIG. 3, the X-ray detector 13 includes a plurality of detection blocks 130 in the channel direction. The detection blocks 130 are coupled in an arc shape so as to be orthogonal to the irradiation direction (one-way arrows in FIG. 3) of X-rays. While a situation in which five detection blocks 130 are coupled is illustrated in FIG. 3, it is not limited to this and any number of detection blocks 130 may be coupled.

The detection block 130 includes, in the order from the irradiation direction of X-rays, collimators 131, scintillators 132, photodiode (PD) chip 133, an extension chip 134, and a substrate 135.

The collimators 131 remove scattered rays from the X-rays that are incident on the X-ray detector 13. For example, the collimators 131 are formed of collimator plates arrayed in a lattice shape in the slice direction and the channel direction. Consequently, the scattered rays are removed from the X-rays passing through the collimators 131 and entering the scintillators 132.

The scintillators 132 emit light (scintillator light) by the incidence of X-rays. For example, the scintillators 132 emit the scintillator light the light intensity of which corresponds to the energy of the X-rays entered passing through the collimators 131.

The PD chip 133 is a semiconductor chip stacked on the extension chip 134. The PD chip 133 converts the signals of X-rays into electrical signals. For example, the PD chip 133 converts and outputs the scintillator light into electrical signals according to the energy of the scintillator light generated by the scintillators 132.

The X-rays that are incident on the X-ray detector 13 are, for the X-rays in respective areas divided by the lattice, converted into the scintillator light by the scintillators 132 by going through the lattice formed by the collimators 131. The scintillator light converted for each of the areas is then converted into an electrical signal in the PD chip 133. That is, the scintillators 132 and the PD chip 133 in the area divided by the lattice of the collimators 131 function as a single X-ray detection element.

The extension chip 134 is a semiconductor chip that is formed of the same material as that of the PD chip 133 and is stacked on the substrate 135. For example, the extension chip 134 transmits electrical signals output by the PD chip 133 to the substrate 135.

The substrate 135 receives the electrical signals transmitted from the extension chip 134 and outputs them to the collector 14.

Figure 4:
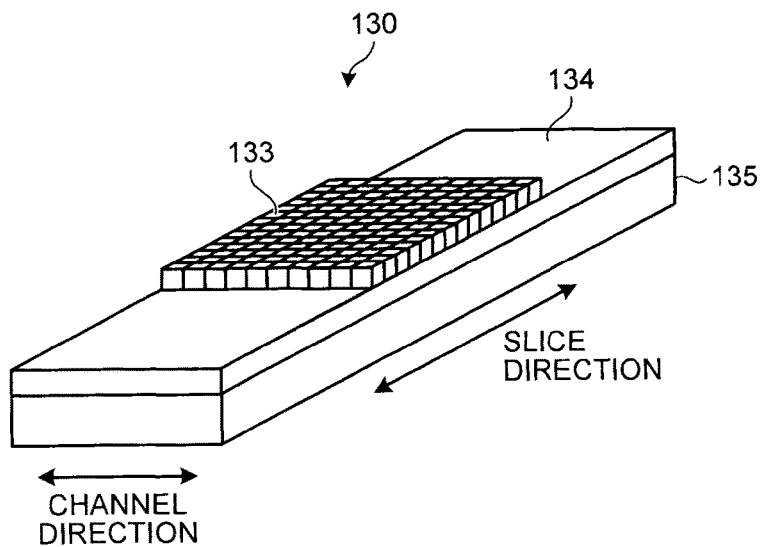
FIG. 4 is a diagram for explaining a detection block in the first embodiment.
Figure 5:
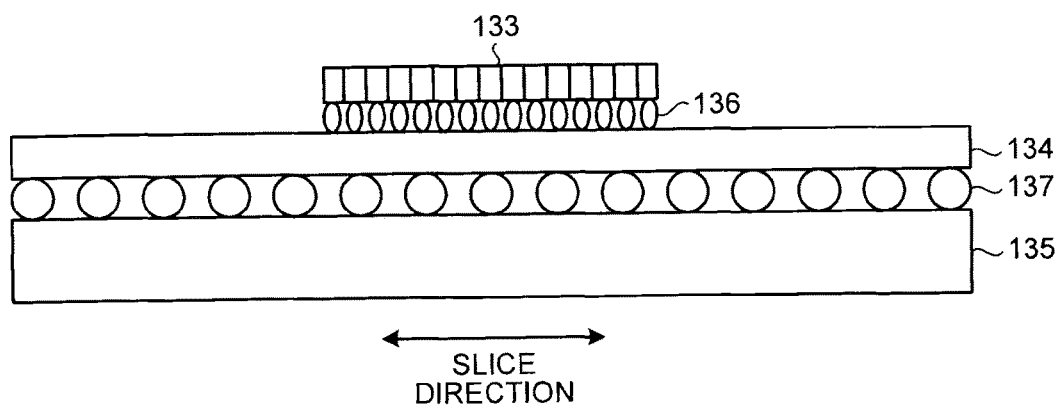
FIG. 5 is a diagram for explaining the detection block in the first embodiment.

FIGS. 4 and 5 are diagrams for explaining the detection block 130 in the first embodiment. In FIG. 4, illustrated is a perspective view of the PD chip 133, the extension chip 134, and the substrate 135. In FIG. 5, illustrated is a cross-sectional view of the PD chip 133, the extension chip 134, and the substrate 135. In FIGS. 4 and 5, the illustration of the collimators 131 and the scintillators 132 is omitted.

As illustrated in FIG. 4, in the detection block 130, the extension chip 134 is stacked on the substrate 135 and the PD chip 133 is then stacked on the extension chip 134. The width of the PD chip 133, the width of the extension chip 134, and the width of the substrate 135 in the channel direction of the X-ray detector 13 are substantially the same. The term of substantially the same means that, although their widths substantially agree with one another, the one that is closer to the X-ray tube 12 is narrower in order to couple a plurality of detection blocks 130 in an arc shape (see FIG. 3). The PD chip 133 is stacked at substantially the center of the extension chip 134 in the slice direction.

In FIG. 5, illustrated is a cross-sectional view of the detection block 130 in FIG. 4 on a plane that is parallel to the irradiation direction of X-rays and to the slice direction.

As illustrated in FIG. 5, the extension chip 134 wires, on a one-to-one basis, ball-shaped electrodes 136 on the PD chip 133 side, and ball-shaped electrodes 137 that are on the substrate 135 side and the pitch (width) of which is larger than that of the ball-shaped electrodes 136. The ball-shaped electrodes 136 and the ball-shaped electrodes 137 are electrodes of a solder ball and the like.

The ball-shaped electrodes 136 are each disposed in each area of the bottom surface of the PD chip 133 divided by the lattice of the collimators 131, and couple the PD chip 133 to the extension chip 134. In the example illustrated in FIG. 5, the PD chip 133 is divided into 15 areas, and the ball-shaped electrodes 136 are each disposed in each of the areas. In FIG. 5, for the sake of convenience in explanation, the surface of the extension chip 134 on the PD chip 133 side is described as "upper surface" and the surface on the substrate 135 side is described as "lower surface."

The extension chip 134 is electrically coupled to the substrate 135 by using the ball-shaped electrodes 137 the number of which is identical to that of the ball-shaped electrodes 136 that couple with the PD chip 133. In the example illustrated in FIG. 5, the extension chip 134 is coupled to the substrate 135 by using 15 ball-shaped electrodes 137.

The extension chip 134 includes connection pads and penetration electrodes that connect the ball-shaped electrodes 136 on the upper surface and the ball-shaped electrodes 137 on the lower surface on a one-to-one basis. Because the pitch of the ball-shaped electrodes 136 is smaller than that of the ball-shaped electrodes 137, the signal lines are drawn around on the extension chip 134 until the pitch becomes connectable to the ball-shaped electrodes 137. Specifically, the penetration electrodes are provided so as to run through the upper surface and the lower surface of the extension chip 134 at the locations of the respective ball-shaped electrodes 137. The signal lines are provided on the upper surface of the extension chip 134 so as to connect the penetration electrodes to the respective ball-shaped electrodes 136. Consequently, the extension chip 134 transmits each of the electrical signals output by the PD chip 133 to a given electrode of the substrate 135 on a one-to-one basis.

In general, a semiconductor chip and a substrate are formed of different materials. In such a case, on the surfaces of the semiconductor chip and the substrate facing each other, it is difficult to align the connection pads of the both precisely. Thus, when connecting the semiconductor chip with the substrate by a ball grid array (BGA) method, there are limitations in narrowing the pitch (width) of the ball-shaped electrodes. For example, in the example in FIG. 5, when coupling the extension chip 134 to the substrate 135 with the ball-shaped electrodes 137, there are limitations in narrowing the pitch of the ball-shaped electrodes 137.

Meanwhile, the extension chip 134 in the first embodiment is formed of the same material as that of the PD chip 133. For example, the extension chip 134 and the PD chip 133 are formed with silicon wafers (of silicon). Thus, on the surfaces of the extension chip 134 and the PD chip 133 facing each other, the connection pads of the both can be precisely aligned by a semiconductor process. Consequently, because the extension chip 134 can be coupled to the PD chip 133 with small ball-shaped electrodes 136, the pitch of the ball-shaped electrodes 136 can be made narrower than that of the ball-shaped electrodes 137.

That is, in the X-ray detector 13, the pitch of the detection elements can be narrowed according to the pitch of the ball-shaped electrodes 136. Thus, the X-ray detector 13 can yield the X-ray detection in higher definition.

The width of the extension chip 134 in the slice direction is larger than that of the PD chip 133 because the pitch of the ball-shaped electrodes 136 has been made narrower than that of the ball-shaped electrodes 137. That is, to collect the signals of X-rays detected by N pieces of the detection elements simultaneously in the substrate 135 without bundling requires N pieces of the ball-shaped electrodes 136 and N pieces of the ball-shaped electrodes 137. Because the pitch of the ball-shaped electrodes 137 is wider than that of the ball-shaped electrodes 136, the area required for arranging the ball-shaped electrodes 137 is wider if the number of the ball-shaped electrodes 137 and the number of the ball-shaped electrodes 136 are the same (N pieces). Thus, the width of the extension chip 134 is larger than that of the PD chip 133 in the slice direction.

In the example in FIG. 5, explained has been a situation of achieving the high definition by narrowing the pitch of the ball-shaped electrodes 136 in the slice direction. However, the high definition can also be achieved in the channel direction in the same manner. In this case also, the area required for arranging the ball-shaped electrodes 137 becomes wider along with the implementation of high definition. However, as described above, the width of the PD chip 133, the width of the extension chip 134, and the width of the substrate 135 in the channel direction of the X-ray detector 13 are substantially the same (FIG. 4). Thus, even when the high definition is achieved in the channel direction, the area for arranging the ball-shaped electrodes 137 is secured, without altering the width of the extension chip 134 in the channel direction, by increasing the width in the slice direction.

In FIGS. 4 and 5, explained has been a situation of the PD chip 133 being stacked at substantially the center of the extension chip 134 in the slice direction. However, the embodiment is not limited to this. The PD chip 133 only needs to be stacked on the extension chip 134, not being limited to the center thereof.

As in the foregoing, the X-ray CT apparatus in the first embodiment includes the X-ray detector that includes the substrate 135, the extension chip 134 that is stacked on the substrate 135, and the PD chip 133 that is stacked on the extension chip 134 and converts the signals of X-rays into electrical signals. The extension chip 134 is formed of the same material as that of the PD chip 133, and wires the ball-shaped electrodes 136 on the PD chip 133 side and the ball-shaped electrodes 137 on the substrate 135 side larger than the ball-shaped electrodes 136 on a one-to-one basis. Thus, the X-ray CT apparatus in the first embodiment enables the X-ray detection in higher definition.

In the foregoing first embodiment, explained has been a situation of the PD chip 133, the extension chip 134, and the substrate 135 being stacked on a one-to-one basis. The embodiment, however, is not limited to this. For example, a plurality of PD chips 133 may be stacked on a single extension chip 134, and a plurality of extension chips 134 may be stacked on a single substrate 135.

Other Embodiments

While the first embodiment has been described above, the embodiment may be implemented in various different forms other than the first embodiment.

Stacking DAS Chips on Extension Chip 134

In the first embodiment, explained has been a situation of the PD chip 133 being stacked on the extension chip 134. On the extension chip 134, however, DAS chips may be stacked separately from the PD chip 133.

Figure 6:
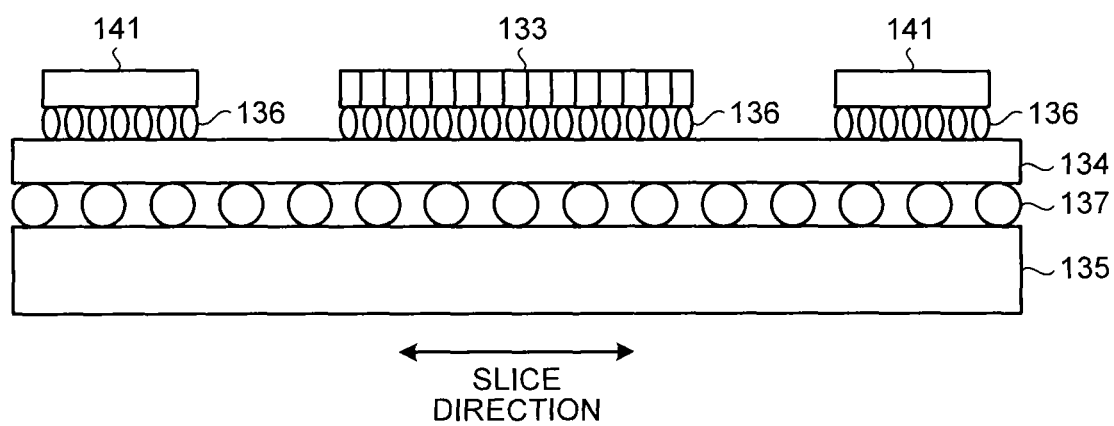
FIG. 6 is a diagram for explaining a situation in which DAS chips are stacked on an extension chip.

FIG. 6 is a diagram for explaining a situation in which DAS chips 141 are stacked on the extension chip 134. In FIG. 6, illustrated is a cross-sectional view on the same plane as that of the cross-sectional view in FIG. 5.

As illustrated in FIG. 6, the DAS chips 141, separately from the PD chip 133, are stacked on the extension chip 134 by using the ball-shaped electrodes 136. On the material of the DAS chips 141 also, forming the DAS chips 141 with the same material (for example, silicon wafers) as that of the PD chip 133 and the extension chip 134 enables the ball-shaped electrodes 136 smaller than the ball-shaped electrodes 137 to be used. The DAS chips 141 convert electrical signals (analog signals) output from the PD chip 133 into digital signals.

The extension chip 134 includes connection pads and penetration electrodes that connect on a one-to-one basis the ball-shaped electrodes 136 on the surface of the PD chip 133 side, the ball-shaped electrodes 137 on the surface of the substrate 135 side, and the ball-shaped electrodes 136 on the surfaces of the DAS chip 141 side. Specifically, the signal lines for analog signals are provided on the upper surface of the extension chip 134 so as to connect the ball-shaped electrodes 136 on the PD chip 133 side and the ball-shaped electrodes 136 on the DAS chip 141 side on a one-to-one basis. The penetration electrodes are provided so as to run through the upper surface and the lower surface of the extension chip 134 at the locations of the respective ball-shaped electrodes 137. The signal lines for digital signals converted by the DAS chips 141 are provided so as to connect the ball-shaped electrodes 136 on the DAS chip 141 side to the respective penetration electrodes provided at the locations of the respective ball-shaped electrodes 137 on a one-to-one basis.

Consequently, the extension chip 134 transmits each of the electrical signals output by the PD chip 133 to a given electrode of the DAS chips 141 on a one-to-one basis. The DAS chips 141 then perform amplification processing, A/D conversion processing, and others on the respective signals of X-rays detected by the PD chip 133. The extension chip 134 transmits the digital signals after the processing by the DAS chips 141 to the substrate 135.

Consequently, the X-ray CT apparatus can shorten the distance in which the signals of X-rays detected by the PD chip 133 are transmitted as analog signals. Thus, the X-ray CT apparatus can improve the S/N ratio.

In FIG. 6, illustrated has been a situation in which the extension chip 134 and the DAS chips 141 are coupled by the ball-shaped electrodes 136 of a narrow pitch. However, it is not limited to this and they may be coupled by the ball-shaped electrodes 137.

Expansion of Detection Block 130

The detection block 130 may be expanded by juxtaposing in the slice direction two pieces of the detection blocks 130 described in the first embodiment, for example.

Figure 7:
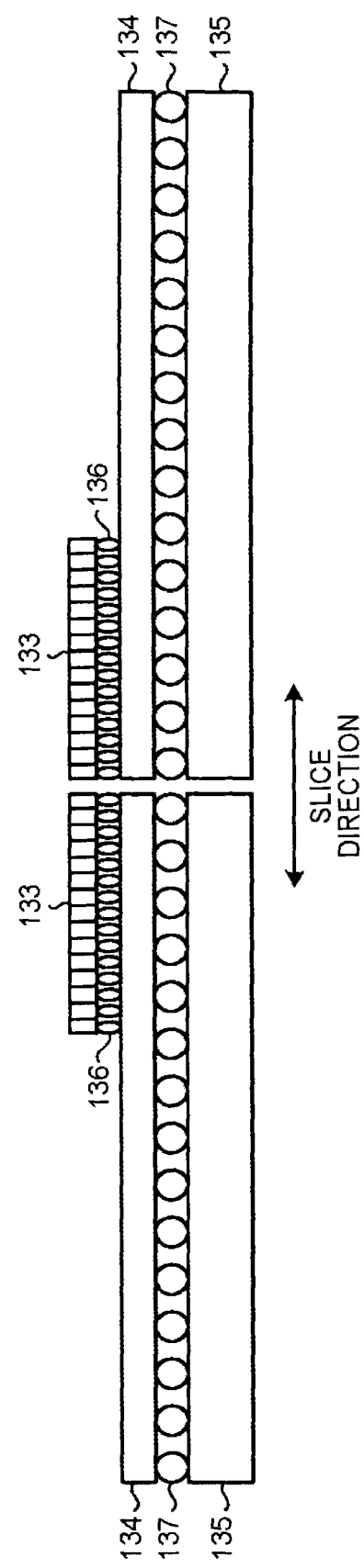
FIG. 7 is a diagram for explaining the expansion of the detection block.

FIG. 7 is a diagram for explaining the expansion of the detection block 130. In FIG. 7, illustrated is a cross-sectional view on the same plane as that of the cross-sectional view in FIG. 5.

As illustrated in FIG. 7, the PD chips 133 are stacked at respective ends of the extension chips 134 in the slice direction. The detection block 130 has a structure in which two pieces of semiconductor-chip stacked bodies each stacked with the PD chip 133 at the end of the extension chip 134 in the slice direction are juxtaposed in the slice direction such that the ends on the stacked side face each other.

Even if there are manufacturing limitations in the size of the extension chip 134 as a semiconductor chip, the detection block 130 larger than that size can be produced by expanding the detection block 130 in the manner described above. Consequently, the X-ray CT apparatus enables the width that is simultaneously receivable in the slice direction to be secured.

Location of Control Circuits

The X-ray detector may include control circuits that control the read-out of the electrical signals converted by the respective elements (detection elements). In this case, the extension chip 134 may include the control circuits.

Figure 8:
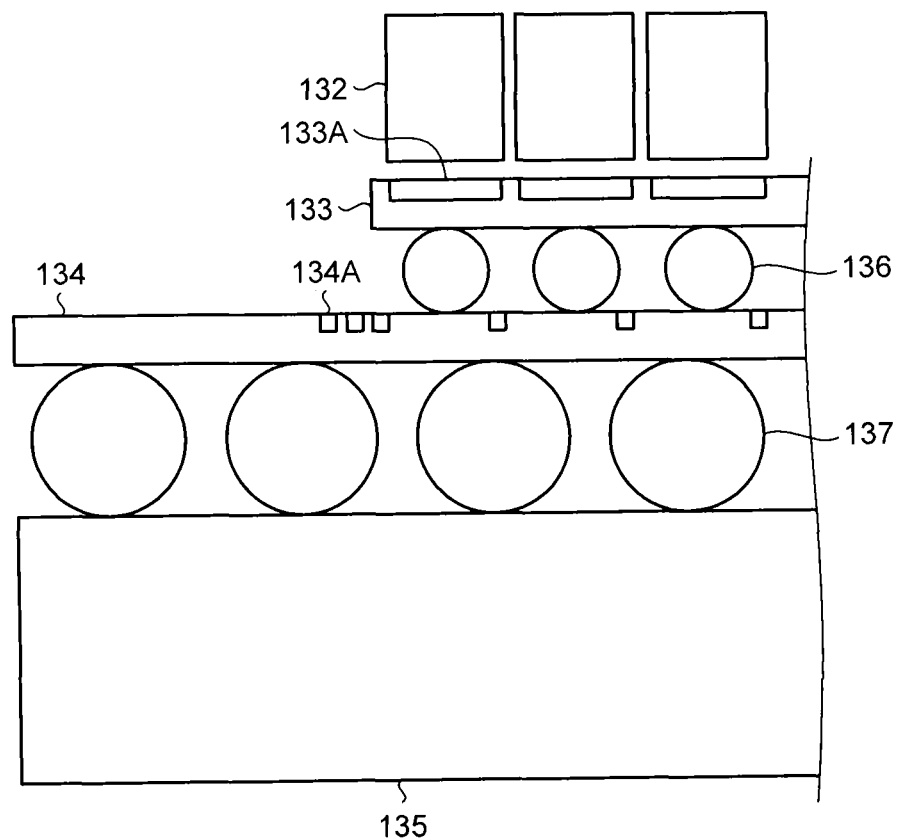
FIG. 8 is a diagram for explaining the location of a control circuit.
Figure 9:
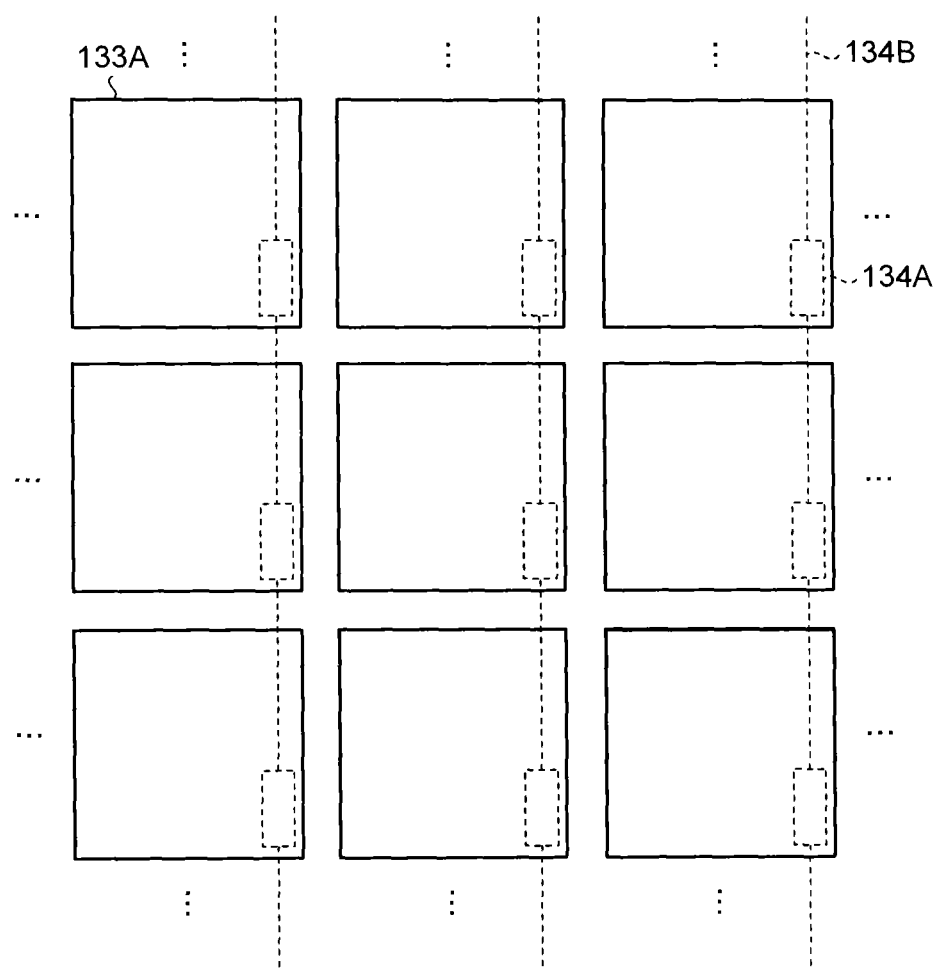
FIG. 9 is a diagram for explaining the location of a control circuit.

FIGS. 8 and 9 are diagrams for explaining the locations of the control circuits. In FIG. 8, illustrated is a cross-sectional view of the PD chip 133, the extension chip 134, and the substrate 135. In FIG. 9, a diagram of the PD chip 133 in FIG. 8 viewed from the scintillators 132 side is illustrated.

As illustrated in FIGS. 8 and 9, in the PD chip 133, a plurality of detection elements 133A are formed on the surface of the scintillators 132 side, for example. Each of the detection elements 133A is an element that is composed of a photodiode (PD), and converts and accumulates scintillator light into an electrical signal according to the energy of the scintillator light generated from the scintillator 132, for example. To achieve high definition, the detection element 133A has an area (size) that is comparable to that of the ball-shaped electrode 136 or is slightly greater than that of the ball-shaped electrode 136, and is disposed for each of the scintillators 132 (see FIG. 8).

The detection elements 133A are coupled to respective control circuits 134A, for example, so that the electrical signals accumulated in the detection elements 133A are read out. The control circuits 134A each include, for example, a switch and are coupled by a signal line 134B disposed in the slice direction (see FIG. 9). That is, the control circuits 134A, by switching the switch on and off appropriately, each align the read-out timings in the channel direction in a sequential collection method and change a slice thickness in a simultaneous collection method, for example. In FIG. 9, because the control circuits 134A and the signal lines 134B are not present on the PD chip 133 but are disposed on the extension chip 134 that is a lower layer of the PD chip 133, they are indicated by broken lines.

The extension chip 134 includes the control circuits 134A. That is, the control circuits 134A provided on the extension chip 134 control the read-out of the electrical signals from the detection elements 133A on the PD chip 133. Consequently, the X-ray detector does not need to include the control circuits 134A on the PD chip 133. Thus, the X-ray detector can increase the ratio of areas of the detection elements 133A, that is, sensitive areas, on the PD chip 133.

In other words, when providing the control circuits 134A on the PD chip 133, the control circuits 134A are provided between the respective detection elements 133A, for example. In this case, because the areas of the detection elements 133A are narrowed according to the size of the control circuits 134A, the sensitive areas on the PD chip 133 are narrowed. In contrast, when the extension chip 134 includes the control circuits 134A, because the control circuits 134A are not provided on the PD chip 133, the sensitive areas on the PD chip 133 can be sufficiently secured.

In this case, it is not necessary to provide the control circuits 134A on the substrate 135 either. Thus, the X-ray detector can contribute to the narrowing of the substrate 135 itself.

Note that the above-described examples are mere examples. In FIG. 8, illustrated has been a situation of the extension chip 134 including five control circuits 134A, for example. The embodiment, however, is not limited to this. The extension chip 134 may include any number of the control circuits 134A as necessary, for example.

In accordance with at least one of the embodiments in the foregoing, the X-ray detection in higher definition can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An X-ray computed tomography apparatus, comprising:
an X-ray detector, wherein
the X-ray detector comprises
a first semiconductor chip including a plurality of elements configured to convert X-rays into an electrical signal,
a substrate configured to collect the electrical signal from each element,
a second semiconductor chip provided between the first semiconductor chip and the substrate and formed of same material as that of the first semiconductor chip,
a plurality of first electrodes configured to couple each element of the first semiconductor chip to the second semiconductor chip, and
a plurality of second electrodes that are configured to couple the second semiconductor chip to the substrate and are larger than the first electrodes, and
the second semiconductor chip wires the first electrodes and the second electrodes on a one-to-one basis, includes penetration electrodes configured to run through a surface of the substrate side and a surface of the first semiconductor chip side at locations of the second electrodes, and includes signal lines configured to connect the penetration electrodes to the first electrodes on the surface of the first semiconductor chip side.

2. The X-ray computed tomography apparatus according to claim 1, wherein a width of the substrate in a rotation direction of the X-ray detector, a width of the first semiconductor chip, and a width of the second semiconductor chip are substantially same.

3. The X-ray computed tomography apparatus according to claim 1, wherein the first semiconductor chip is stacked at substantially a center of the second semiconductor chip in a slice direction.

4. The X-ray computed tomography apparatus according to claim 1, wherein
the first semiconductor chip is stacked at an end of the second semiconductor chip in a slice direction, and
the X-ray detector has a structure in which two pieces of semiconductor-chip stacked bodies stacked with the first semiconductor chip at the end of the second semiconductor chip in the slice direction are juxtaposed in the slice direction such that the ends face each other.

5. The X-ray computed tomography apparatus according to claim 1, wherein the first semiconductor chip and the second semiconductor chip are formed of silicon.

6. The X-ray computed tomography apparatus according to claim 1, wherein the second semiconductor chip includes a control circuit configured to control read-out of the electrical signal converted by each element.

7. An X-ray computed tomography apparatus, comprising:
an X-ray detector, wherein
the X-ray detector comprises
a first semiconductor chip including a plurality of elements configured to convert X-rays into an electrical signal,
a substrate configured to collect the electrical signal from each element, a second semiconductor chip provided between the first semiconductor chip and the substrate and formed of a same material as that of the first semiconductor chip,
a third semiconductor chip stacked on the second semiconductor chip and configured to convert the electrical signal into a digital signal,
a plurality of first electrodes configured to couple each element of the first semiconductor chip to the second semiconductor chip,
a plurality of second electrodes that are configured to couple the second semiconductor chip to the substrate and are larger than the first electrodes, and
a plurality of third electrodes configured to couple the second semiconductor chip to the third semiconductor chip, and
the second semiconductor chip wires the first electrodes and the third electrodes on a one-to-one basis, wires the third electrodes and the second electrodes on a one-to-one basis, includes signal lines configured to connect the first electrodes to the third electrodes on a surface of the first semiconductor chip side, includes penetration electrodes configured to run through a surface of the substrate side and the surface of the first semiconductor chip side at locations of the second electrodes, and includes signal lines configured to connect the penetration electrodes to the third electrodes on the surface of the first semiconductor chip side.

8. The X-ray computed tomography apparatus according to claim 7, wherein the second semiconductor chip includes a control circuit configured to control read-out of the electrical signal converted by each element.

9. An X-ray detector, comprising:
a first semiconductor chip including a plurality of elements configured to convert X-rays into an electrical signal;
a substrate configured to collect the electrical signal from each element;
a second semiconductor chip provided between the first semiconductor chip and the substrate and formed of same material as that of the first semiconductor chip;
a plurality of first electrodes configured to couple each element of the first semiconductor chip to the second semiconductor chip; and
a plurality of second electrodes that are configured to couple the second semiconductor chip to the substrate and are larger than the first electrodes, wherein
the second semiconductor chip wires the first electrodes and the second electrodes on a one-to-one basis, includes penetration electrodes configured to run through a surface of the substrate side and a surface of the first semiconductor chip side at locations of the second electrodes, and includes signal lines configured to connect the penetration electrodes to the first electrodes on the surface of the first semiconductor chip side.

10. The X-ray detector according to claim 9, wherein the second semiconductor chip includes a control circuit configured to control read-out of the electrical signal converted by each element.

* * * * *